(12) United States Patent
He et al.

(10) Patent No.: US 9,798,171 B2
(45) Date of Patent: Oct. 24, 2017

(54) LIQUID CRYSTAL PANEL, METHOD FOR MANUFACTURING THE SAME AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Quanhua He, Beijing (CN); Lingyun Shi, Beijing (CN); Hao Zhang, Beijing (CN); Zijiao Xue, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 329 days.

(21) Appl. No.: 14/492,792

(22) Filed: Sep. 22, 2014

(65) Prior Publication Data
US 2015/0253604 A1    Sep. 10, 2015

(30) Foreign Application Priority Data
Mar. 7, 2014    (CN) .......................... 2014 1 0083489

(51) Int. Cl.
*G02F 1/133*    (2006.01)
*G02F 1/1335*    (2006.01)
(Continued)

(52) U.S. Cl.
CPC .......... *G02F 1/13318* (2013.01); *G02F 1/133* (2013.01); *G02F 1/13306* (2013.01);
(Continued)

(58) Field of Classification Search
CPC ............... G02F 1/13306; G02F 1/1337; G02F 1/133514; G02F 1/134309; G02F 1/133345; G02F 1/13318; G02F 1/133
See application file for complete search history.

(56) References Cited

U.S. PATENT DOCUMENTS

| 2010/0245741 A1* | 9/2010 | Chung ................. H01L 31/068 349/116 |
| 2014/0307192 A1* | 10/2014 | Stahl ...................... G02F 1/155 349/139 |
| 2015/0338691 A1* | 11/2015 | Lun ................... G02F 1/133514 257/72 |

FOREIGN PATENT DOCUMENTS

| CN | 200959057 Y | 10/2007 |
| CN | 101840100 A | 9/2010 |

(Continued)

OTHER PUBLICATIONS

First Office Action regarding Chinese application No. 201410083489.3, dated Feb. 3, 2016. Translation provided by Dragon Intellectual Property Law Firm.

*Primary Examiner* — Dung Nguyen
(74) *Attorney, Agent, or Firm* — Harness, Dickey & Pierce, P.L.C.

(57) ABSTRACT

The present disclosure discloses a liquid crystal panel, a method for manufacturing the same and a display device. The liquid crystal panel includes an array substrate, a color filter substrate oppositely arranged to the array substrate, liquid crystal arranged between the array substrate and the color filter substrate, and a solar battery arranged at a position corresponding to a non-pixel region of the array substrate or the color filter substrate. Two ends of the solar battery contact with the array substrate and the color filter substrate, respectively. By disposing the solar battery at the position corresponding to the non-pixel region of the array (Continued)

substrate or the color filter substrate and making the two ends of the solar battery contact with the array substrate and the color filter substrate, respectively, the solar battery can not only play a supporting function, but also play a shielding function between adjacent pixels.

19 Claims, 6 Drawing Sheets

(51) Int. Cl.
    *G02F 1/1339*     (2006.01)
    *H01L 31/042*     (2014.01)
    *H01L 25/16*     (2006.01)
    *H01L 31/048*     (2014.01)

(52) U.S. Cl.
    CPC .... G02F 1/13394 (2013.01); G02F 1/133512 (2013.01); *G02F 2001/13324* (2013.01); *H01L 25/167* (2013.01); *H01L 31/042* (2013.01); *H01L 31/048* (2013.01); *H01L 2924/0002* (2013.01); *Y02E 10/50* (2013.01)

(56) References Cited

FOREIGN PATENT DOCUMENTS

| | | |
|---|---|---|
| CN | 101900898 A | 12/2010 |
| CN | 101995691 A | 3/2011 |
| JP | 4251622 B2 | 4/2009 |
| WO | WO-2013-047362 A1 | 4/2013 |

\* cited by examiner

LIQUID CRYSTAL PANEL, METHOD FOR MANUFACTURING THE SAME AND DISPLAY DEVICE

CROSS-REFERENCE TO RELATED APPLICATION

This application claims priority to Chinese Patent Application No. 201410083489.3 filed on Mar. 7, 2014, the disclosures of which are incorporated in their entirety by reference herein.

TECHNICAL FIELD

The present disclosure relates to the field of liquid crystal display technology, in particular to a liquid crystal panel, a method for manufacturing the same, and a display device.

BACKGROUND

Liquid Crystal Displays (LCDs) have been the main force of the display industry due to advantages such as light, low power consumption, active display and digitalization. In an existing liquid crystal panel, if there is no black matrix, light emitted from a liquid crystal layer can leak out to an adjacent pixel region, which affects image contrast ratio. Meanwhile, outside light, directly or indirectly through reflection and scattering, irradiates onto an a-Si (amorphous silicon) layer in a channel region of a Thin Film Transistor (TFT) device, and this can degrade switching characteristic of the TFT device, result in crosstalk phenomenon and reduce image quality.

For the problems such as light leakage and the crosstalk phenomenon between adjacent pixel units, an existing liquid crystal panel generally arranges the black matrix between a variety of sub-pixel color filter layers of a color filter substrate. Structures such as TFT, a scanning line are arranged in a region corresponding to the black matrix, and are required to be shielded by the black matrix. FIG. 1 is a schematic diagram showing a structure of the existing liquid crystal panel. The existing liquid crystal panel includes an array substrate 100 and a color filter substrate 200. The color filter substrate 200 in FIG. 1 includes a base substrate 2B, a sub-pixel color filter layer 16 and a black matrix 17. The sub-pixel color filter layer 16 and the black matrix 17 are arranged in the same layer. A common electrode layer 3 and an alignment layer 4B are also arranged below the sub-pixel color filter layer 16 and the black matrix 17. The black matrix 17 on the color filter substrate 200 is usually arranged corresponding to a region in the array substrate 100 where the TFT structure, the data line and the scanning line are located, to cover and shield the region. The TFT includes a drain electrode 12, a gate electrode 13, a semiconductor active layer 14 and a source electrode and lead 15. The array substrate 100 includes a first base substrate 2A, a storage capacitor bottom electrode 11, a gate insulating layer 10, a pixel electrode 9 and a protection layer 8. The light leakage may be reduced and the image contrast ratio may be improved by providing the black matrix 17.

To one pixel unit, the black matrix 17 occupies a too large area, which results in that an aperture ratio of pixel in the existing structure maintains only approximately 55%, and a resolution ratio and a viewing angle of the liquid crystal panel are also limited.

SUMMARY

One technical problem to be solved by one embodiment of the present disclosure is how to raise the aperture ratio of pixel of the liquid crystal panel and expand the viewing angle of the liquid crystal panel.

In order to solve the above technical problem, one embodiment of the present disclosure provides a liquid crystal panel, including an array substrate, a color filter substrate oppositely arranged to the array substrate, liquid crystal arranged between the array substrate and the color filter substrate, and a solar battery arranged at a position corresponding to a non-pixel region of the array substrate or the color filter substrate; two ends of the solar battery contact with the array substrate and the color filter substrate, respectively.

Further, the solar battery has an elastic thin film structure, and is arranged between a first alignment layer of the array substrate and a second alignment layer of the color filter substrate.

Further, the liquid crystal panel further includes a first metal shield layer and a first transparent insulting layer sequentially arranged between the first alignment layer and the solar battery, and a second transparent insulting layer and a second metal shield layer sequentially arranged between the second alignment layer and the solar battery; wherein positions of the first transparent insulting layer, the first metal shield layer, the second transparent insulting layer and the second metal shield layer correspond to a position of the solar battery.

Further, the solar battery is distributed in an array, and the position of the solar battery corresponds to a position of a scanning line and/or a data line in the array substrate.

Further, a width of the solar battery is three to five times of that of the scanning line and/or the data line.

Further, the color filter substrate includes a base substrate, a plurality of sub-pixel color filter layers and a common electrode layer sequentially arranged between the base substrate and the second alignment layer; wherein the plurality of sub-pixel color filter layers are arranged in the same layer; edges of adjacent sub-pixel color filter layers are contacted with each other; and the solar battery is arranged close to an edge region between the adjacent sub-pixel color filter layers.

Further, an outside surface of the solar battery is coated with a black light absorbing layer.

In order to solve the above technical problem, one embodiment of the present disclosure further provides a display device, including the above liquid crystal panel and a power storage device connected to the solar battery in the liquid crystal panel, to store electrical energy generated by the solar battery.

Further, the display device further includes positive and negative electrode leads arranged between the solar battery and a first transparent insulting layer of the liquid crystal panel and between the solar battery and a second transparent insulting layer of the liquid crystal panel, wherein the positive and negative electrode leads are connected to an anode and a cathode of the power storage device, respectively.

In order to solve the above technical problem, one embodiment of the present disclosure further provides a method of manufacturing a liquid crystal panel, including:

providing a color filter substrate and an array substrate;

forming a solar battery at a position corresponding to a non-pixel region on the color filter substrate or the array substrate, to maintain a cell gap between the array substrate and the color filter substrate; and making two ends of the solar battery contact with the array substrate and the color filter substrate, respectively, and arranging liquid crystal between the array substrate and the color filter substrate, after that the array substrate and the color filter substrate are oppositely arranged to form a cell.

Further, the forming a solar battery at a position corresponding to a non-pixel region on the color filter substrate or the array substrate includes:

forming a solar battery having an elastic thin film structure at the position corresponding to the non-pixel region on the color filter substrate or the array substrate through a thin film production process in such a manner that the solar battery is distributed in an array.

Further, the providing the array substrate includes:
providing a first base substrate;
forming a pattern of a scanning line and/or a data line on the first base substrate; and
forming a protection layer and a first alignment layer on the first base substrate on which the pattern of the scanning line and/or the data line are formed.

Further, the forming a solar battery at a position corresponding to a non-pixel region on the array substrate includes:

sequentially forming a first metal shield layer, a first transparent insulting layer, the solar battery, a second transparent insulating layer and a second metal shield layer on the first base substrate on which the first alignment layer is formed, where positions of the first transparent insulating layer, the first metal shield layer, the second transparent insulating layer, the second metal shield layer and the solar battery correspond to a position of the scanning line and/or the data line.

Further, the providing a color filter substrate includes:
providing a second base substrate;
forming a pattern of a plurality of sub-pixel color filter layers on the second base substrate, wherein the plurality of sub-pixel color filter layers are arranged in the same layer, and edges of adjacent sub-pixel color filter layers are contacted with each other; and forming a common electrode layer and a second alignment layer on the second base substrate on which the pattern of the sub-pixel color filter layer is formed.

Further, the forming a solar battery at a position corresponding to a non-pixel region on the color filter substrate includes:

sequentially forming a second metal shield layer, a second transparent layer, the solar battery, a first transparent insulting layer and a first metal shield layer on the second base substrate on which the common electrode layer and the second alignment layer are formed, wherein positions of the first transparent insulating layer, the first metal shield layer, the second transparent insulating layer and the second metal shield layer correspond to a position of the solar battery, and the solar battery is formed close to an edge region between adjacent sub-pixel color filter layers.

Further, a width of the solar battery is three to five times of that of the scanning line and/or the data line.

Further, the step of forming a solar battery at a position corresponding to a non-pixel region on the color filter substrate or the array substrate further includes: forming a black light absorbing layer on an outside surface of the solar battery.

Further, the method further includes: forming positive and negative electrode leads between the solar battery and the first transparent insulting layer and between the solar battery and the second transparent insulating layer, respectively; wherein the positive and negative electrode leads are connected to an anode and a cathode of a power storage device, respectively In the liquid crystal panel and the method for manufacturing the same provided by embodiments of the present disclosure, by disposing the solar battery at the position corresponding to the non-pixel region of the array substrate or the color filter substrate and making the two ends of the solar battery contact with the array substrate and the color filter substrate, respectively, the solar battery can not only play a supporting function, but also play a shielding function between adjacent pixels, which can improve the aperture ratio of the pixel, eliminate the problem of optical crosstalk between pixel units and expand the viewing angle; since the black matrix which is originally arranged between adjacent sub-pixel color filter layers at interval is replaced by the sub-pixel color filter layer, thus the manufacturing of the black matrix can be omitted, the process is simple and the manufacturing cost can be also reduced. Meanwhile, one embodiment of the present disclosure further provides a display device which includes the above liquid crystal panel.

DETAILED DESCRIPTION

Figure 1:
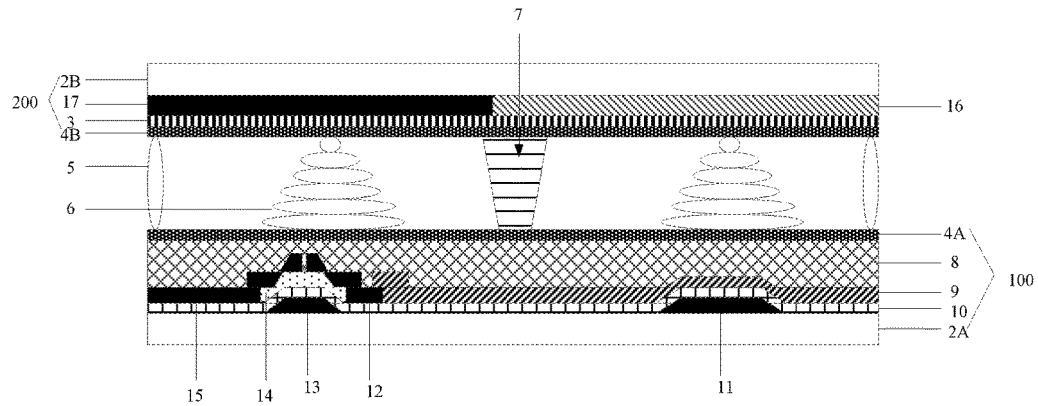
FIG. 1 is a schematic diagram showing a structure of a liquid crystal panel in the prior art.
Figure 2:
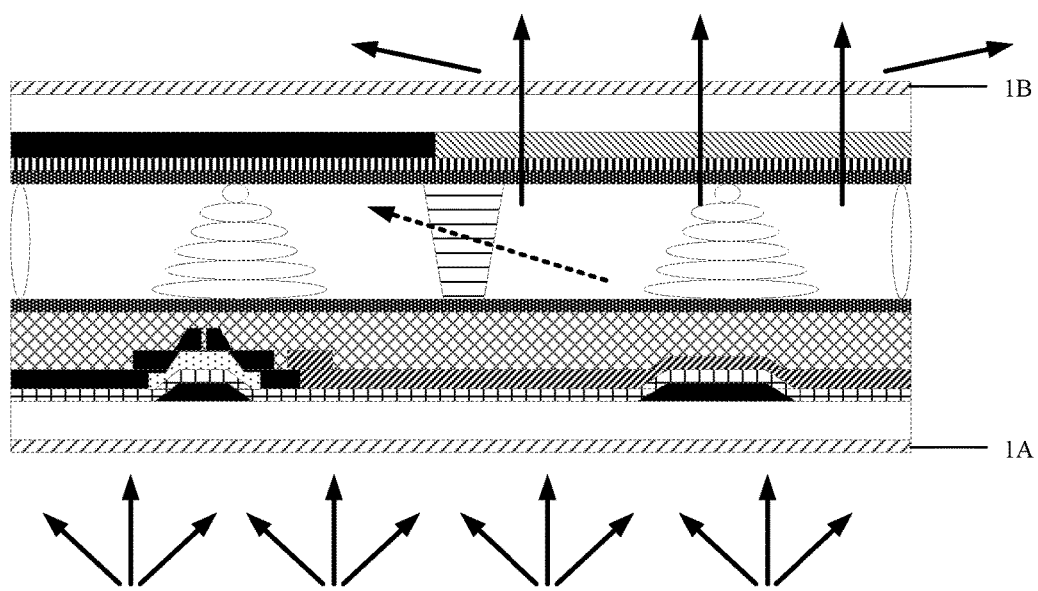
FIG. 2 is a schematic diagram showing transmission of light after the light transmits through a polarizer in the prior art.

According to the foregoing, as shown in FIG. 2, a first polarizer 1A is arranged at an outside side of the array substrate 100, and a second polarizer 1B is arranged at an outside side of the color filter substrate 200. FIG. 2 is a schematic diagram showing transmission of light emitted from a backlight source after the light transmits through the first polarizer 1A, where a solid line represents light transmitting through the TFT, and a dotted line represents light that is absorbed or diffused and does not transmit through the TFT. It may be seen that a part of light in the liquid crystal layer 6 is absorbed by a post spacer 7, and a part of the light in the liquid crystal layer 6 transmits through a gap between the post spacers 7 and hits onto the black matrix 17. Since the black matrix 17 is opaque, thus the light hitting onto the black matrix 17 is unable to be displayed normally. Meanwhile, a small part of the light in the liquid crystal layer 6 may be incident to an adjacent pixel unit, which results in light crosstalk and reduces image quality.

Specific implementations of the present disclosure will be described hereinafter in conjunction with the accompanying drawings and embodiments. The following embodiments are only used for illustration, and are not intended to limit the scope of the present disclosure.

First Embodiment

Figure 3:
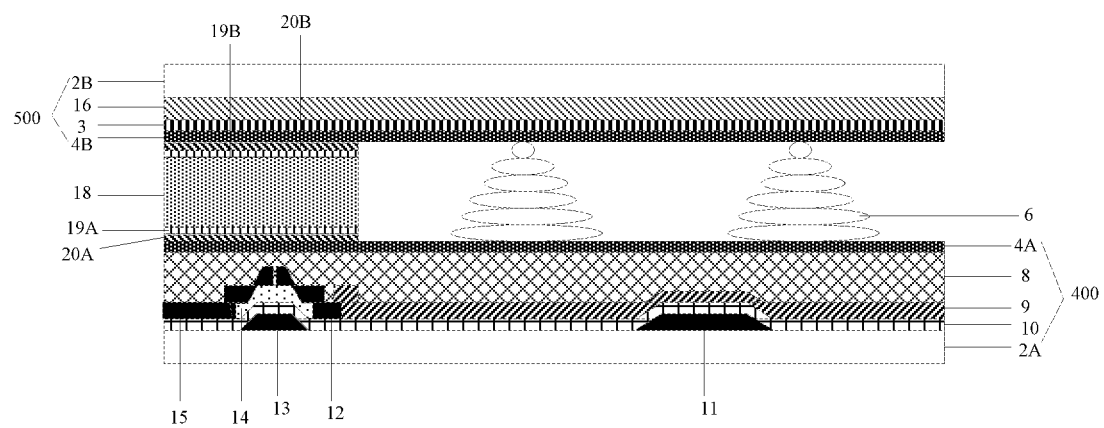
FIG. 3 is a schematic diagram showing a structure of a liquid crystal panel according to a first embodiment of the present disclosure.

The first embodiment of the present disclosure provides a liquid crystal panel. FIG. 3 is a schematic diagram showing a structure of the liquid crystal panel. The liquid crystal panel includes an array substrate 400, a color filter substrate 500, liquid crystal 6 arranged between the array substrate 400 and the color filter substrate 500, and a solar battery 18 arranged at a position corresponding to a non-pixel region of the array substrate 400 or the color filter substrate 500. Two ends of the solar battery 18 contact with the array substrate 400 and the color filter substrate 500, respectively, so as to maintain a cell gap between the array substrate 400 and the color filter substrate 500. In one embodiment, the non-pixel region is a region which does not affect normal display, such as a region corresponding to the TFT on the array substrate 400, a region corresponding to the data line and the scanning line, or a region corresponding to a position where different sub-pixels on the color filter substrate 500 are joined together.

By disposing the solar battery 18 at the position corresponding to the non-pixel region of the array substrate 400 or the color filter substrate 500 and making the two ends of the solar battery 18 contact with the array substrate 400 and the color filter substrate 500, respectively, the solar battery 18 can not only play a supporting function, but also play a shielding function between adjacent pixels, which can not only improve the aperture ratio of the pixel, eliminate the problem of optical crosstalk between pixel units, expand the viewing angle, omit manufacturing the black matrix and make the process simple, but also reduce production cost.

Optionally, in one embodiment, the solar battery 18 has an elastic thin film structure, and is arranged between a first alignment layer 4A of the array substrate 400 and a second alignment layer 4B of the color filter substrate 500. Specifically, in one embodiment, an inner structure of the solar battery 18 may employ a blend membrane system, a dual-layer membrane system, a laminated membrane system or the like. A thickness of the liquid crystal layer 6 is guaranteed by the solar battery 18. The solar battery 18 may be made of an elastic organic semiconductor material which can realize the supporting function of the post spacer 7 and has a good restorability, so that the solar battery 18 and the post spacer 7 have common physical characteristic, that is, the solar battery 18 can realize the supporting function of the post spacer 7.

The solar battery 18 has a thin film structure, and may be obtained through a thin film production process such as sputtering. There is a wide variety of organic semiconductor material, as long as the physical characteristic of the solar battery 18 meets requirements of supporting function and restorability of post spacers in liquid crystal display devices.

Further, a first metal shield layer 20A and a first transparent insulting layer 19A are sequentially arranged between the first alignment layer 4A and the solar battery 18. A second transparent insulting layer 19B and a second metal shield layer 20B are sequentially arranged between the second alignment layer 4B and the solar battery 18. Positions of the first transparent insulting layer 19A, the first metal shield layer 20A, the second transparent insulting layer 19B and the second metal shield layer 20B correspond to a position of the solar battery 18.

Further, the solar battery 18 is distributed in an array, and the position of the solar battery 18 corresponds to a position of the scanning line and/or the data line (not shown in the drawings) in the array substrate 400. The distribution form of the solar battery array is the same as a wiring of a TFT electrode lead, and the solar battery array may completely cover the TFT, all TFT electrode leads, the scanning lines and the data lines in the array substrate 40. A reasonable distribution of the solar battery 18 can also achieve the purpose of high aperture ratio, low light leakage and energy conservation.

Further, a width of the solar battery 18 is three to five times of that of the scanning line and/or the data line. This may reduce an interference of a transverse electric field at an edge of the pixel to the liquid crystal, and may guarantee high aperture ratio, thus having a strong practicability.

Further, the color filter substrate 500 includes a base substrate (the base substrate here refers to a second base substrate 2B which is used when manufacturing the color filter substrate 500). A plurality of sub-pixel color filter layers 16 and a common electrode layer 3 are sequentially arranged between the second base substrate 2B and the second alignment layer 4B. The plurality of sub-pixel color filter layers 16 are arranged in the same layer, and edges of adjacent sub-pixel color filter layers 16 are contacted with each other. The solar battery 18 is arranged close to an edge area between adjacent sub-pixel color filter layers 16, that is, the solar battery 18 is arranged at a position where a red-pixel color filter layer is joined to a green-pixel color filter layer, or a position where a red-pixel color filter layer is joined to a blue-pixel color filter layer. There is no black matrix or gap between two adjacent sub-pixel color filter layers 16 having different colors.

Further, an outside surface of the solar battery 18 is coated with a black light absorbing layer which may fully absorb stray light at the edge of the pixel and improve the image contrast ratio. Meanwhile, when the outside surface of the solar battery 18 is black, the photoelectric conversion efficiency is also high.

It should be noted that the solar battery 18 may be made onto the array substrate 400, and may also be made onto the color filter substrate 500. After the array substrate 400 and the color filter substrate 500 are oppositely arranged to form a cell, liquid crystal is then arranged between the array substrate 400 and the color filter substrate 500 to obtain a liquid crystal panel having the solar battery 18.

In order to avoid interference caused by the current generated by the solar battery 18 to voltages of the pixel electrode 9 and the common electrode layer 3, a first metal shield layer 20A is arranged between the solar battery 18 and the first alignment layer 4A, and a second metal shield layer 20B is arranged between the solar battery 18 and the second alignment 4B. Positions of the first metal shield layer 20A and the second metal shield layer 20B correspond to the position of the solar battery 18.

Figure 4:
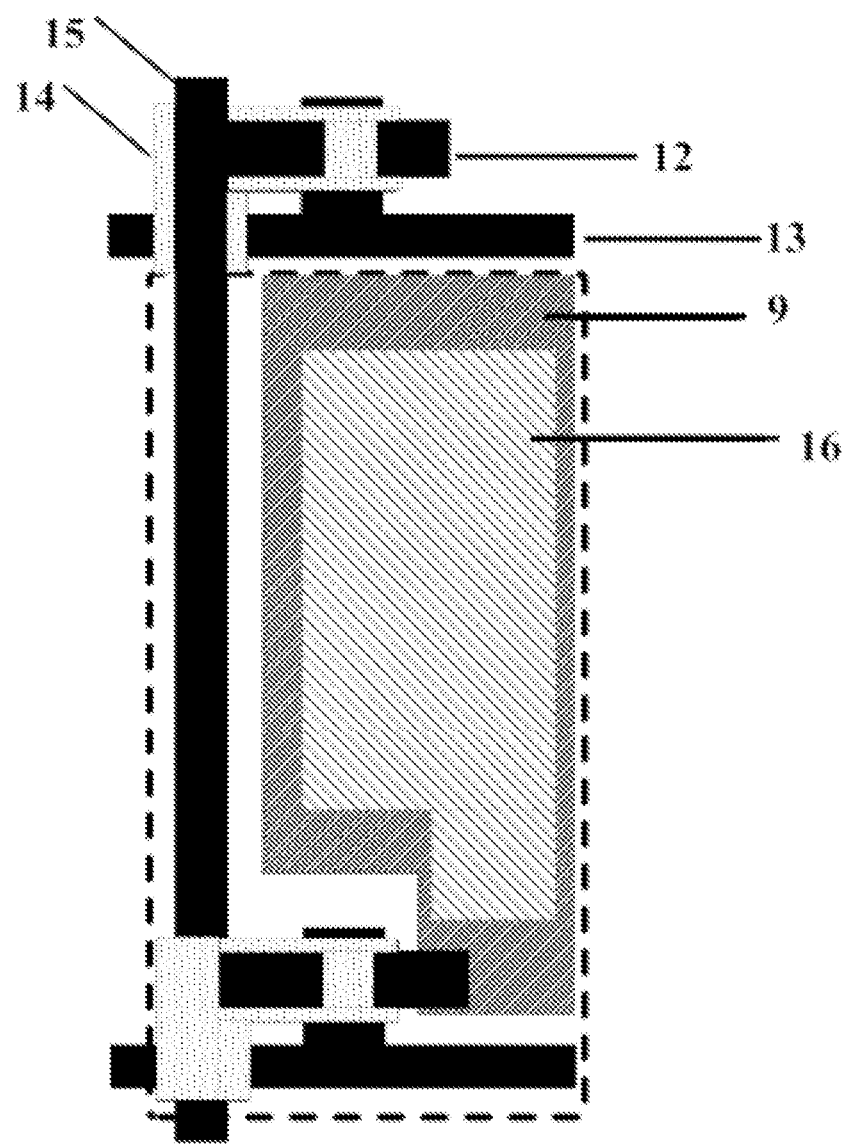
FIG. 4 is a schematic diagram showing a planar structure of a pixel unit of an existing liquid crystal panel.
Figure 5:
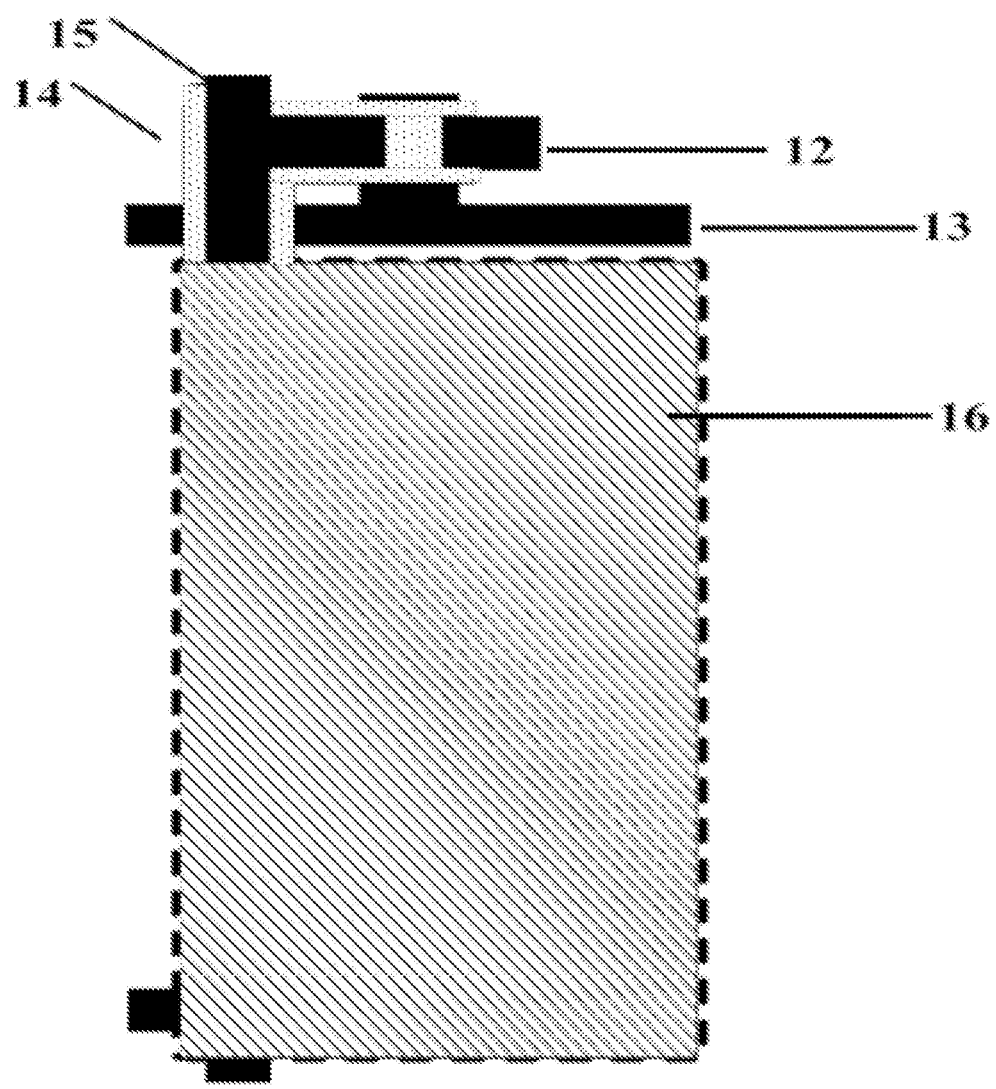
FIG. 5 is a schematic diagram showing a planar structure of a pixel unit of the liquid crystal panel according to the first embodiment of the present disclosure.
Figure 6:
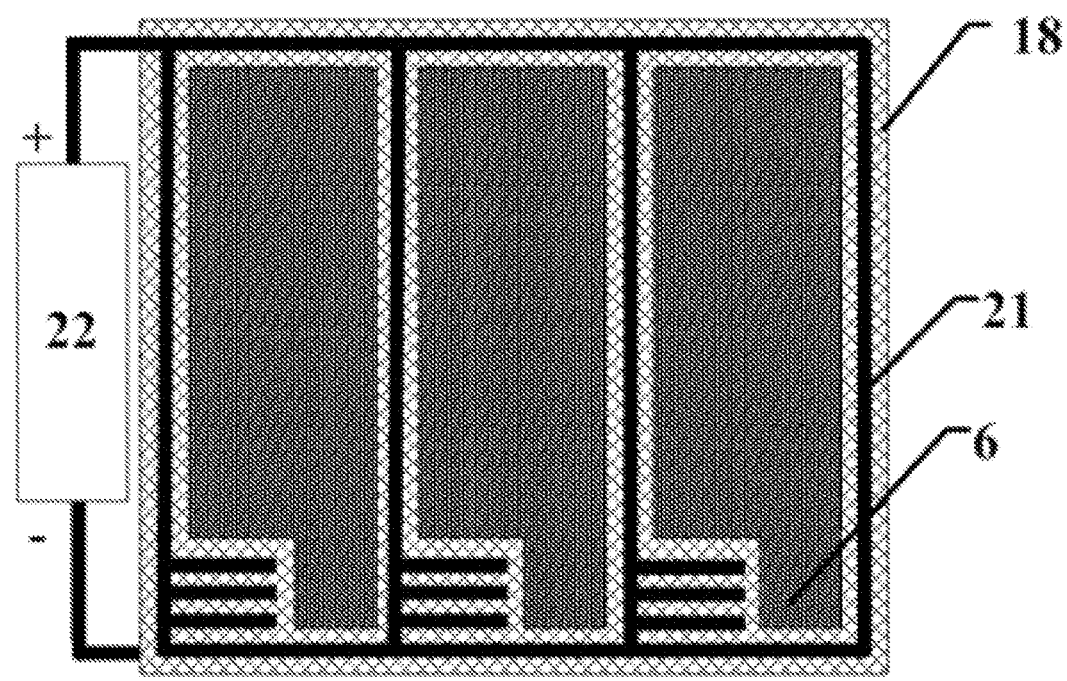
FIG. 6 is a schematic diagram showing a position where a solar battery is arranged according to a second embodiment of the present disclosure.

FIG. 4 is a schematic diagram showing a planar structure of a pixel unit of an existing liquid crystal panel, a dashed box represents one pixel unit in TFT-LCD structure, and a block matrix is arranged in a region except for the sub-pixel color filter layer 16 (i.e. a pixel region). The aperture ratio of pixel is defined as a ratio of an area of the sub-pixel color filter layer 16 to a total area of the pixel unit. In order to guarantee the image contrast ratio, the black matrix in the general liquid crystal structure cannot be further narrowed, therefore, the aperture ratio of pixel is generally approximately 55%. FIG. 5 is a schematic diagram showing a planar structure of a pixel unit in a liquid crystal panel according to one embodiment of the present disclosure, where a dashed box represents one pixel unit in the TFT-LCD structure. A sub-pixel color filter layer 16 having the same color occupies an entire region (including a pixel region and a non-pixel region) where the pixel unit is; that is, there is no black matrix. The position of the solar battery 18 is as shown in FIG. 6, since the liquid crystal is separated into different fixed areas, thus, it may alleviate an undesirable phenomenon such as Mura caused by gravity to some extent. In addition, since the sub-pixel color filter layer 16 usually has only trichromatic (Red-Green-Blue) color filter and a manufacturing process and an installation process of the black matrix can be omitted, thus, the manufacturing cost can be reduced. Only light having a wavelength conforming to transmission wavelength of the color filter center can transmit through the color filter due to the filtering characteristic of the color filter. The black matrix is omitted between the adjacent sub-pixel color filter layers 16, however, since there is the solar battery 18 at the original position of the black matrix, thus the image quality of the liquid crystal panel is not reduced.

The pixel unit shown in FIG. 4 includes a pixel electrode 9, a drain electrode 12, a gate line and gate electrode 13, an active semiconductor layer 14, a source electrode and lead 15 and a sub-pixel color filter layer 16. The pixel unit shown in FIG. 5 includes a drain electrode 12, a gate electrode 13, an active semiconductor layer 14, a source electrode and lead 15 and a sub-pixel color filter 16. It may be seen by comparing FIG. 4 and FIG. 5 that the sub-pixel color filter layer 16 in FIG. 4 cannot cover the thin film transistor, but the sub-pixel color filter layer 16 in FIG. 5 can cover the thin film transistor corresponding to the sub-pixel unit. Assumed that a width of the sub-pixel unit is 60 microns, a width of each electrode lead in TFT is 5 microns, a paving width of the organic solar battery is 15 microns, the aperture ratio of pixel may at least reach above 45/60=75%. Applying the liquid crystal panel of one embodiment of the present disclosure can effectively reduce brightness of a backlight source, and saves a large amount of energy source. The width of the solar battery 18 is three to five times of that of the scanning line and/or the data line, this can not only effectively reduce mutual interference between the current of the solar battery 18 and the TFT-LCD signal, but also guarantee high aperture ratio of pixel, and thus the product has strong practicability. Since the aperture ratio of pixel is improved, and a viewing angle of the liquid crystal display is also expanded and the display effect of the TFT-LCD is improved, thus, market competitiveness is enhanced.

It should be noted that the width of the solar battery 18 is not fixed uniquely, as long as the effect of no light leakage can be achieved. Based on the experience, as long as the width of the solar battery 18 is three to five times of that of the scanning line and/or the data line, the effect of no light leakage can be achieved. If the width is too large, the production cost will be increased. The solar battery 18 can also extend the duration of flight of the product, and the solar energy is green energy.

To sum up, in the liquid crystal panel according to one embodiment of the present disclosure, by disposing the solar battery 18 at the position corresponding to the non-pixel region of the array substrate 400 or the color filter substrate 500 and making the two ends of the solar battery 18 contact with the array substrate 400 and the color filter substrate 500, respectively, the solar battery 18 can not only play a supporting function to maintain the cell gap between the array substrate 400 and the color filter substrate 50, and but also improve the aperture ratio of pixel, eliminate the problem of optical crosstalk between pixel units and expand the viewing angle. Since the solar battery array is located at the non-pixel region, thus the aperture ratio of pixel is not affected; meanwhile, internal back light and external environmental light can be substantially utilized to extend display time, which can effectively reduce the brightness of the backlight source and save a large amount of energy. The black matrix which is originally arranged between adjacent sub-pixel color filter layers at interval is replaced by the sub-pixel color filter layer 16, and there are only sub-pixel color filter layers of three colors (RGB) in the pixel region, thus the manufacturing process and the installation process of the black matrix can be omitted and the manufacturing cost can be reduced. Only light having a wavelength conforming to transmission wavelength of the color filter center can transmit through the color filter due to the filtering characteristic of the color filter. The black matrix is omitted between the adjacent sub-pixel color filter layers 16, however, since there is the solar battery 18 at the original position of the black matrix, thus the image quality of the liquid crystal panel is not reduced. The introduction of the solar battery 18 can fully utilize the solar energy to extend the duration of fight of the product, which is consistent with the trend of green energy.

Second Embodiment

The second embodiment of the present disclosure further provides a display device. The display device further includes a power storage device 22 (referred to FIG. 6) besides the above liquid crystal panel. The power storage device 22 is connected to the solar battery 18 in the liquid crystal panel, to store electrical energy generated by the solar battery 18.

Optionally, in one embodiment, the power storage device 22 is connected to the solar battery 18 as follows. Positive and negative electrode leads 21 are arranged between the solar battery 18 and the first transparent insulting layer 19A and between the solar battery 18 and the second transparent insulting layer 19B. The positive and negative electrode leads 21 are connected to an anode and a cathode of the power storage device 22, respectively. In order to avoid short circuit between the positive and negative electrode leads 21 of the solar battery 18 and the first metal shield layer 20A or the second metal shield layer 20B, a first transparent insulting layer 19A and a second transparent insulating layer 19B are arranged between the solar battery 18 and the first metal insulating layer 20A and between the solar battery 18 and the second metal shielding layer 20B, respectively. The positive and negative electrode leads 21 are arranged on an upper surface and a lower surface (the lower surface refers to a surface of the solar battery 18 contacting with the first transparent insulting layer 19A, and the upper surface refers to a surface of the solar battery 18 contacting with the second transparent insulting layer 19B) of the solar battery 18, to feed the current generated by the solar battery 18 to the external power storage device 22.

As shown in FIG. 6, since the solar battery 18 and the TFT are at different heights, thus the positive and negative electrode leads 21 do not contact with the Tape Carrier Package (TCP) in a liquid crystal display region. The positive and negative electrode leads 21 do not contact with an electrode of the display device for displaying, and the positive and negative electrode leads 21 are also shielded by the metal shield layers 20A, 20B, therefore, the normal display of the display device is not affected; since an insulting process is performed on output terminals of the positive and negative electrode leads 21, the positive and negative electrode leads 21 are also not short-circuited with a source signal line and a gate signal line of the TFT.

Figure 7:
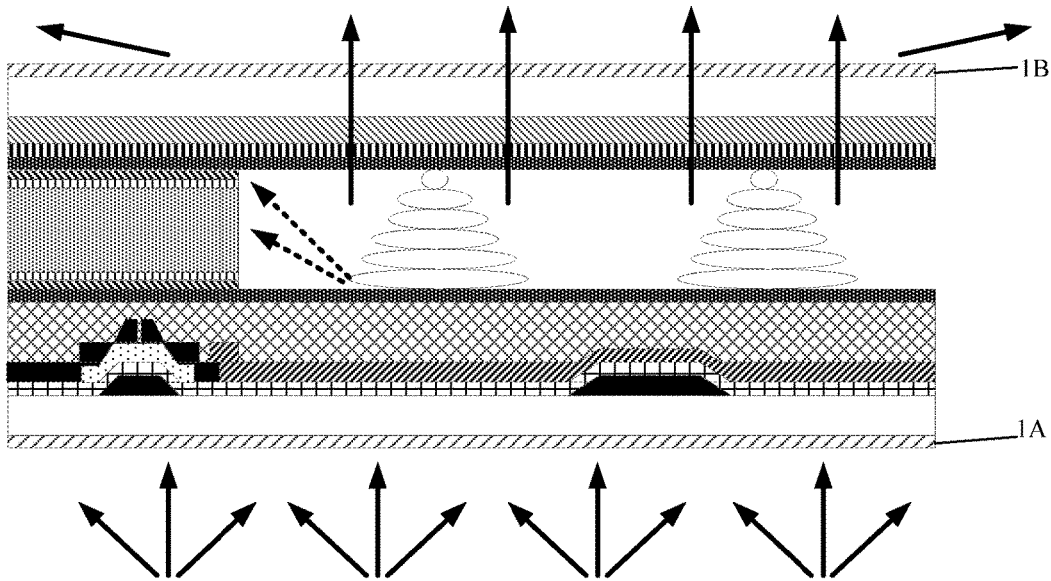
FIG. 7 is a schematic diagram showing transmission of light after the light transmits through a polarizer in a display device according to the second embodiment of the present disclosure.

FIG. 7 is a schematic diagram showing transmission of light after the light transmits through the first polarizer in the display device according to one embodiment. A first polarizer 1A and a second polarizer 1B are arranged at an outside side of the array substrate 400 and an outside side of the color filter substrate 500 of the display device, respectively. Light emitted by the backlight source becomes polarized light after transmitting through the first polarizer 1A, and the polarized light transmits through the transparent pixel electrode 9 after passing through the first base substrate 2A. When transmitting through the liquid crystal layer 6, the transmittance of the polarized light is under control of an electric field between electrodes (the pixel electrode 9 and the common electrode 3) at two sides of the liquid crystal layer and the brightness of the pixel unit may be changed by adjusting the electric field of the liquid crystal layer. Light having different brightness is filtered through the sub-pixel color filter layer 16, and an orderly combination of three color light having different brightness may form an image viewed by the human eye.

Since the surface of the organic solar battery 18 is black, thus most of light hitting on the surface of the solar battery 18 is absorbed, and the problem of optical crosstalk between the pixel units does not occur. In addition, the solar battery 18 only absorbs light incident onto the surface thereof, other light is not affected. Therefore, in the TFT structure, a phenomenon of light bend does not occur. Therefore, most light directly transmits through the TFT and then emits outside. It may be seen by comparing FIG. 7 and FIG. 2 that, the transmittance of the liquid crystal panel of one embodiment of the present disclosure is greater than that of the existing liquid crystal panel. This is because the area occupied by the organic solar battery 18 is smaller than the area of the black matrix.

To sum up, in the liquid crystal display device according to one embodiment of the present disclosure, the liquid crystal panel which includes the solar battery 18 with its two ends respectively contacting with the array substrate 400 and the color filter substrate 500, is connected to the anode and the cathode of the power storage device 22 via the positive and negative electrode leads 21, respectively, and the electric energy generated by the solar battery 18 is stored in the power storage device 22. In addition, the display device also has the advantageous effect of the liquid crystal panel according to the first embodiment, which will not be repeated here.

Third Embodiment

Figure 8:
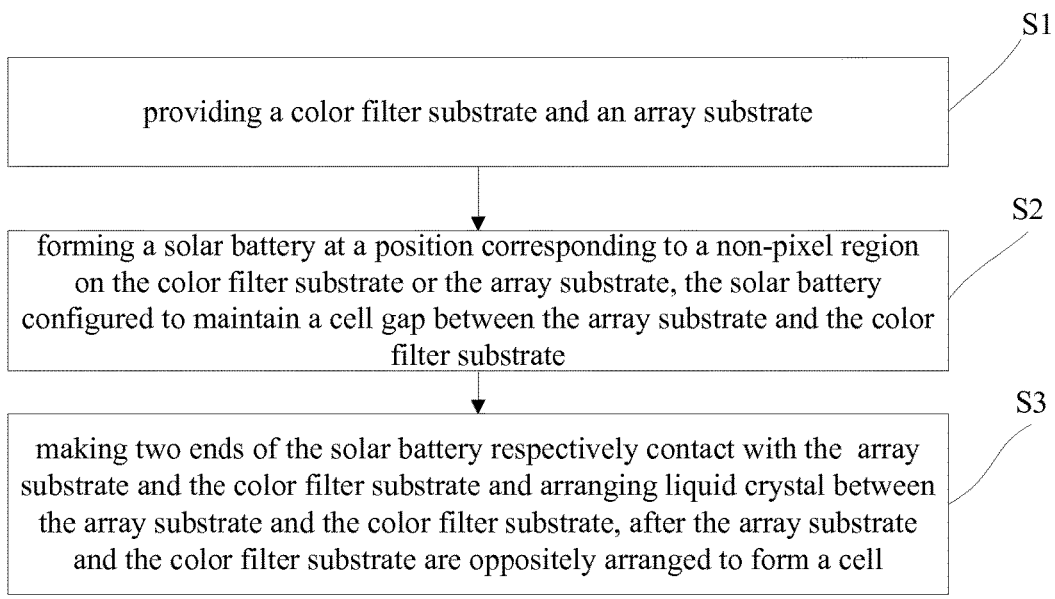
FIG. 8 is a schematic diagram showing a flow of steps of a method for manufacturing a liquid crystal panel according to a third embodiment of the present disclosure.

The third embodiment of the present disclosure further provides a method for manufacturing a liquid crystal panel. FIG. 8 shows a flow of steps of the method. The method specifically includes steps as follows.

Step S1: providing a color filter substrate 500 and an array substrate 400;

Step S2: forming a solar battery 18 at a position corresponding to a non-pixel region on the color filter substrate 500 or the array substrate 400, the solar battery 18 configured to maintain a cell gap between the array substrate 400 and the color filter substrate 500;

Step S3: making two ends of the solar battery 18 contact with the array substrate 400 and the color filter substrate 500, respectively, and arranging liquid crystal 6 between the array substrate 400 and the color filter substrate 500, after the array substrate 400 and the color filter substrate 500 are oppositely arranged to form a cell.

Optionally, forming a solar battery 18 at a position corresponding to a non-pixel region on the color filter substrate 500 or the array substrate 400 specifically includes:

forming a solar battery 18 having an elastic thin film structure at the position corresponding to the non-pixel region on the color filter substrate 500 or the array substrate 400 through a thin film production process in such a manner that the solar battery 18 is distributed in an array. The distribution form of the solar battery array is the same as the wiring of a TFT electrode lead, and the solar battery array may completely cover the TFT, all TFT electrode leads, the scanning lines and the data lines on the array substrate 400. A reasonable distribution of the solar battery 18 can also achieve the purpose of high aperture ratio, low light leakage and energy conservation.

It should be noted that the solar battery 18 according to one embodiment of the present disclosure may be made onto the array substrate 400, and may also be made onto the color filter substrate 500. If the solar battery 18 is made on the array substrate 400, the step of providing the array substrate 400 in step S1 specifically includes:

Step S11: providing a first base substrate 2A;

Step S12: forming a pattern of a scanning line and/or a data line on the first base substrate 2A;

Step S13: forming a protection layer 8 and a first alignment layer 4A on the first base substrate 2A on which the pattern of the scanning line and/or the data line is formed.

Then, forming a solar battery 18 at a position corresponding to a non-pixel region on the array substrate 400 specifically includes:

Step S14: sequentially forming a first metal shield layer 20A, a first transparent insulting layer 19A, the solar battery 18, a second transparent insulting layer 19B and a second metal shield layer 20B on the first base substrate 2A on which the first alignment layer 4A is formed; positions of the first transparent insulting layer 19A, the first metal shield layer 20A, the second transparent insulting layer 19B, the second metal shield layer 20B and the solar battery 18 correspond to the position of the scanning line and/or data line.

If the solar battery 18 is made on the array substrate 500, the step of proving the color filter substrate 500 in step S1 specifically includes:

Step S11': providing a second base substrate 2B;

Step S12': forming a pattern of a plurality of sub-pixel color filter layers 16 on the second base substrate 2B; the plurality of sub-pixel color filter layers 16 being formed in the same layer, and edges of adjacent sub-pixel color filter layers 16 being contacted with each other;

Step S13': forming a common electrode layer 3 and a second alignment layer 4B on the second base substrate 2B on which the pattern of the sub-pixel color filter layers 16 is formed.

Then, forming a solar battery 18 at a position corresponding to a non-pixel region on the color filter substrate 500 specifically includes:

Step S14': sequentially forming a second metal shield layer 20B, a second transparent insulting layer 19B, the solar battery 18, a first transparent insulting layer 19A and a first metal shield layer 20A on the second base substrate 2B on which the common electrode layer 3 and the second alignment layer 4B are formed; positions of the first transparent insulting layer 19A, the first metal shield layer 20A, the second transparent insulting layer 19B and the second metal shield layer 20B corresponding to the position of the solar battery 18, and the solar battery 18 being formed close to an edge region between adjacent sub-pixel color filter layers 16.

Since the solar battery 18 has a thin film structure made of an organic semiconductor material, thus it may be obtained through a thin film production process such as sputtering.

Optionally, when manufacturing the solar battery 18, the width of the solar battery 18 is three to five times of that of the scanning line and/or the data line. This may reduce an interference caused by a transverse electric field at an edge of the pixel to the liquid crystal, and may guarantee high aperture ratio, thus having a strong practicability.

Further, the step of forming a solar battery 18 at a position corresponding to a non-pixel region on the color filter substrate 500 or the array substrate 400 further includes:

forming a black light absorbing layer on an outside surface of the solar battery 18.

Moreover, the method further includes:

forming positive and negative electrode leads 21 between the solar battery 18 and the first transparent insulting layer 19A and between the solar battery 18 and the second transparent insulting layer 19B, respectively, to connect the solar battery 18 to an anode and a cathode of a power storage device 22 via the positive and negative electrode leads 21, respectively, so that electric energy generated by the solar battery 18 is stored in the power storage device 22.

The liquid crystal panel obtained through the method for manufacturing a liquid crystal panel according to the embodiment has the same advantageous effect as the first embodiment described above, which will not be repeated here.

The above embodiments are only used to illustrate the present disclosure, and are not intended to limit the present disclosure. Those skilled in the art may also make various changes and variations without departing from the spirit and scope of the present disclosure, therefore, all equivalent technical solutions will also fall within the scope of the present disclosure, the scope of protection of the present disclosure will be defined by the claims.

What is claimed is:

1. A liquid crystal panel, comprising an array substrate, a color filter substrate oppositely arranged to the array substrate, liquid crystal arranged between the array substrate and the color filter substrate, and a solar battery arranged at a position corresponding to a non-pixel region on the color filter substrate or the array substrate; wherein two ends of the solar battery contact with the array substrate and the color filter substrate, respectively, and wherein the solar battery has an elastic thin film structure, and is arranged between a first alignment layer of the array substrate and a second alignment layer of the color filter substrate.

2. The liquid crystal panel according to claim 1, further comprising a first metal shield layer and a first transparent insulting layer sequentially arranged between the first alignment layer and the solar battery, and a second transparent insulting layer and a second metal shield layer sequentially arranged between the second alignment layer and the solar battery; wherein positions of the first transparent insulting layer, the first metal shield layer, the second transparent insulting layer and the second metal shield layer correspond to a position of the solar battery.

3. The liquid crystal panel according to claim 2, wherein the solar battery is distributed in an array, and the position of the solar battery corresponds to a position of a scanning line and/or a data line in the array substrate.

4. The liquid crystal panel according to claim 3, wherein a width of the solar battery is three to five times of that of the scanning line and/or the data line.

5. The liquid crystal panel according to claim 3, wherein the color filter substrate comprises a base substrate, a plurality of sub-pixel color filter layers and a common electrode layer sequentially arranged between the base substrate and the second alignment layer; wherein the plurality of sub-pixel color filter layers are arranged in the same layer; edges of adjacent sub-pixel color filter layers are contacted with each other; and the solar battery is arranged close to an edge region between the adjacent sub-pixel color filter layers.

6. The liquid crystal panel according to claim 1, wherein an outside surface of the solar battery is coated with a black light absorbing layer.

7. A display device comprising the liquid crystal panel according to claim 1, and a power storage device connected to a solar battery in the liquid crystal panel.

8. The display device according to claim 7, further comprising positive and negative electrode leads arranged between the solar battery and a first transparent insulting layer of the liquid crystal panel and between the solar battery and a second transparent insulting layer of the liquid crystal panel; wherein the positive and negative electrode leads are connected to an anode and a cathode of the power storage device, respectively.

9. A method for manufacturing a liquid crystal panel, comprising:

providing a color filter substrate and an array substrate;

forming a solar battery at a position corresponding to a non-pixel region on the color filter substrate or the array substrate; and making two ends of the solar battery contact with the array substrate and the color filter substrate, respectively, and arranging liquid crystal between the array substrate and the color filter substrate, after the array substrate and the color filter substrate are oppositely arranged to form a cell, wherein the forming the solar battery comprises forming the solar battery to have an elastic thin film structure between a first alignment layer of the array substrate and a second alignment layer of the color filter substrate through a thin film production process.

10. The method according to claim 9, wherein the forming the solar battery comprises:

forming the solar battery in such a manner that the solar battery is distributed in an array through the thin film production process.

11. The method according to claim 10, wherein the providing the array substrate comprises:

providing a first base substrate;

forming a pattern of a scanning line and/or a data line on the first base substrate; and forming a protection layer and the first alignment layer on the first base substrate on which the pattern of the scanning line and/or the data line is formed.

12. The method according to claim 11, wherein the forming the solar battery at a position corresponding to the non-pixel region on the array substrate comprises:

sequentially forming a first metal shield layer, a first transparent insulting layer, the solar battery, a second transparent insulting layer and a second metal shield layer on the first base substrate on which the first alignment layer is formed;

wherein positions of the first transparent insulting layer, the first metal shield layer, the second transparent insulting layer, the second metal shield layer and the solar battery correspond to a position of the scanning line and/or the data line.

13. The method according to claim 12, further comprising:

forming positive and negative electrode leads between the solar battery and the first transparent insulting layer and between the solar battery and the second transparent insulting layer, respectively; wherein the positive and negative electrode leads are connected to an anode and a cathode of a power storage device, respectively.

14. The method according to claim 12, wherein a width of the solar battery is three to five times of that of the scanning line and/or the data line.

15. The method according to claim 11, wherein a width of the solar battery is three to five times of that of the scanning line and/or the data line.

16. The method according to claim 10, wherein the providing the color filter substrate comprises:

providing a second base substrate;

forming a pattern of a plurality of sub-pixel color filter layers on the second base substrate, wherein the plurality of sub-pixel color filter layers are arranged in the same layer, and edges of adjacent sub-pixel color filter layers are contacted with each other;

forming a common electrode layer and the second alignment layer on the second base substrate on which the pattern of the plurality of sub-pixel color filter layers is formed.

17. The method according to claim 16, wherein the forming the solar battery at a position corresponding to the non-pixel region on the color filter substrate comprises:

sequentially forming a second metal shield layer, a second transparent insulting layer, the solar battery, a first transparent insulting layer and a first metal shield layer on the second base substrate on which the common electrode layer and the second alignment layer are formed;

wherein positions of the first transparent insulting layer, the first metal shield layer, the second transparent insulting layer and the second metal shield layer correspond to a position of the solar battery, and the solar battery is formed close to an edge region between adjacent sub-pixel color filter layers.

18. The method according to claim 17, further comprising:

forming positive and negative electrode leads between the solar battery and the first transparent insulting layer and between the solar battery and the second transparent insulting layer, respectively; wherein the positive and negative electrode leads are connected to an anode and a cathode of a power storage device, respectively.

19. The method according to claim 9, wherein the step of forming the solar battery further comprises:

forming a black light absorbing layer on an outside surface of the solar battery.

* * * * *